(12) United States Patent
Lin et al.

(10) Patent No.: US 7,667,335 B2
(45) Date of Patent: Feb. 23, 2010

(54) SEMICONDUCTOR PACKAGE WITH PASSIVATION ISLAND FOR REDUCING STRESS ON SOLDER BUMPS

(75) Inventors: Yaojian Lin, Singapore (SG); Xu Sheng Bao, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 76 days.

(21) Appl. No.: 11/858,749

(22) Filed: Sep. 20, 2007

(65) Prior Publication Data

US 2009/0079070 A1 Mar. 26, 2009

(51) Int. Cl.
*H01L 23/48* (2006.01)
*H01L 23/52* (2006.01)
*H01L 29/40* (2006.01)

(52) U.S. Cl. .............................. 257/779; 257/E23.069
(58) Field of Classification Search .................. 257/779, 257/778, 780, E23.069
See application file for complete search history.

(56) References Cited

U.S. PATENT DOCUMENTS 6,867,122 B2 * 3/2005 Weng .......................... 438/614
7,015,590 B2 3/2006 Jeong et al.
7,122,458 B2 10/2006 Cheng et al.
7,176,583 B2 2/2007 Daubenspeck et al.
7,187,078 B2 3/2007 Lin et al.
2004/0134974 A1 7/2004 Oh et al.
2005/0020047 A1 1/2005 Mis et al.
2007/0075423 A1* 4/2007 Ke et al. ..................... 257/737

* cited by examiner

*Primary Examiner*—David A Zameke
*Assistant Examiner*—Jenny L Wagner
(74) *Attorney, Agent, or Firm*—Robert D. Atkins (57) ABSTRACT

A flip chip style semiconductor package has a substrate with a plurality of active devices formed thereon. A contact pad is formed on the substrate. An under bump metallization (UBM) layer is in electrical contact with the contact pad. A passivation layer is formed over the substrate. In one case, the UBM layer is disposed above the passivation layer. Alternatively, the passivation layer is disposed above the UBM layer. A portion of the passivation layer is removed to create a passivation island. The passivation island is centered with respect to the contact pad with its top surface devoid of the UBM layer. A solder bump is formed over the passivation island in electrical contact with the UBM layer. The passivation island forms a void in the solder bump for stress relief. The UBM layer may include a redistribution layer such that the passivation island is offset from the contact pad.

14 Claims, 5 Drawing Sheets

SEMICONDUCTOR PACKAGE WITH PASSIVATION ISLAND FOR REDUCING STRESS ON SOLDER BUMPS

FIELD OF THE INVENTION

The present invention relates in general to semiconductor packaging, and more particularly, to solder bump structures in flip chip packaging of semiconductor devices.

BACKGROUND OF THE INVENTION

Semiconductor devices are found in many products used in modern society. Semiconductors find applications in consumer items such as entertainment, communications, networks, computers, and household items markets. In the industrial or commercial market, semiconductors are found in military, aviation, automotive, industrial controllers, and office equipment.

The manufacture of semiconductor devices involves formation of a wafer having a plurality of die. Each die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

One goal of semiconductor manufacturing is to produce a package suitable for faster, reliable, smaller, and higher-density integrated circuits (IC) at lower cost. Flip chip packages or wafer level packages (WLP) are ideally suited for ICs demanding high speed, high density, and greater pin counts. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to contact pads disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance. Device reliability is a function of the interconnect material and structural integrity of each solder bump and its effectiveness as an electrical interconnect. The flip chip package also provides enhanced heat dissipation as the backside of the die is exposed to ambient surroundings.

One test to determine the reliability of the flip chip package and interconnects is known as a drop test. A flip chip package, attached to a carrier substrate, is physically dropped a predetermined vertical distance to test the integrity of the flip chip and interconnect strength. The drop test induces stress on the flip chip package by the impact of the package against the test surface. If the solder bump connections are weak or defective, the drop test will crack or break one or more connections and cause the package to fail subsequent inspection or electrical test. It is desirable to increase the strength of the flip chip interconnect to increase the pass rate of the drop test to improve manufacturing yield.

SUMMARY OF THE INVENTION

In one embodiment, the present invention is a semiconductor package comprising a substrate having a plurality of active devices formed thereon. A contact pad is formed on the substrate in electrical contact with the plurality of active devices. An under bump metallization (UBM) layer is disposed above the substrate in electrical contact with the contact pad. A passivation layer is disposed above the substrate. A first and second portion of the passivation layer is removed to create a passivation island. A solder bump is formed over the passivation island in contact with the UBM layer. The passivation island forms a controlled void in the solder bump for stress relief.

In another embodiment, the present invention is a semiconductor package comprising a substrate having a plurality of active devices formed thereon. A contact pad is formed on the substrate in electrical contact with the plurality of active devices. An intermediate conductive layer is disposed above the substrate in electrical contact with the contact pad. A passivation layer is formed over the substrate. A portion of the passivation layer is removed to create a passivation island. A solder bump is formed over the passivation island in contact with the intermediate conductive layer. The passivation island provides stress relief for the solder bump.

In another embodiment, the present invention is a semiconductor package comprising a substrate having a plurality of active devices formed thereon. A contact pad is formed on the substrate in electrical contact with the plurality of active devices. A passivation layer is formed over the substrate. A portion of the passivation layer is removed to create a passivation island. A solder bump is formed over the passivation island in electrical contact with the contact pad. The passivation island forms a controlled void in the solder bump for stress relief.

In another embodiment, the present invention is a method of making a semiconductor package comprising the steps of providing a substrate having a plurality of active devices formed thereon, forming a contact pad on the substrate in electrical contact with the plurality of active devices, disposing an intermediate conductive layer above the substrate in electrical contact with the contact pad, forming a passivation layer above the substrate, removing a portion of the passivation layer to create a passivation island, and forming a solder bump over the passivation island and contacting the intermediate conductive layer. The passivation island forms a controlled void in the solder bump for stress relief.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active front side surface having semiconductor devices disposed thereon, and a backside surface formed with bulk semiconductor material, e.g., silicon. The active front side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Patterning involves use of photolithography to mask areas of the surface and etch away undesired material to form specific structures. The doping process injects concentrations of dopant material by thermal diffusion or ion implantation. The active surface is substantially planar and uniform with electrical interconnects, such as bond pads.

Figure 1:
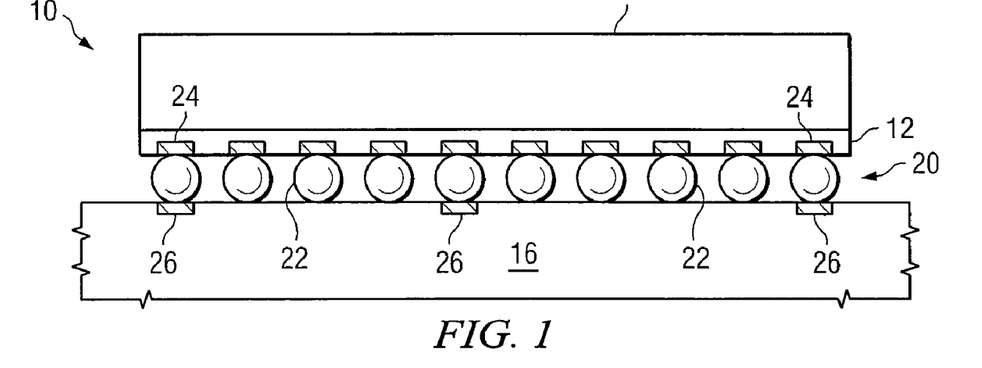
FIG. 1 is a flip chip semiconductor package with solder bumps providing electrical interconnect between an active area of the die and a chip carrier substrate.

Flip chip semiconductor packages and wafer level packages (WLP) are commonly used with integrated circuits (IC's) demanding high speed, high density, and greater pin counts. Flip chip style packaging 10 involves mounting an active area 12 of die 14 down toward a chip carrier substrate or printed circuit board (PCB) 16, as shown in FIG. 1. Active area 12 contains active and passive devices, conductive layers, and dielectric layers according to the electrical design of the die. The electrical and mechanical interconnect is achieved through a solder bump structure 20 comprising a large number of individual conductive solder bumps or balls 22. The solder bumps are formed on bump pads 24 which are disposed on active area 12. The bump pads 24 connect to active circuits by conduction tracks in active area 12. The solder bumps 22 are electrically connected to contact pads 26 on carrier substrate 16 by a solder reflow process. The flip chip semiconductor package provides a short electrical conduction path from the active devices on die 14 to conduction tracks on carrier substrate 16 in order to reduce signal propagation, lower capacitance, and achieve overall better circuit performance.

Figure 2A:
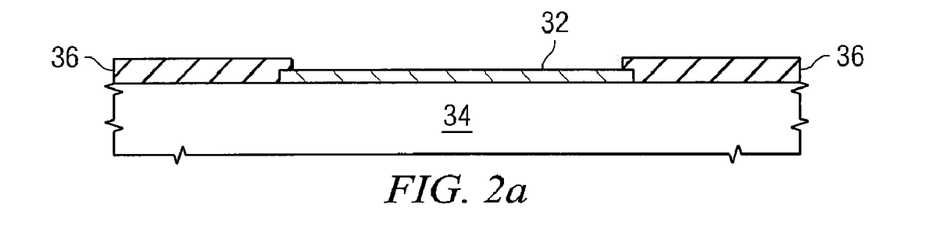
FIGS. 2a-2c illustrate formation of first and second passivation layers over the substrate to form a passivation island in the center of the metal contact pad.
Figure 2B:
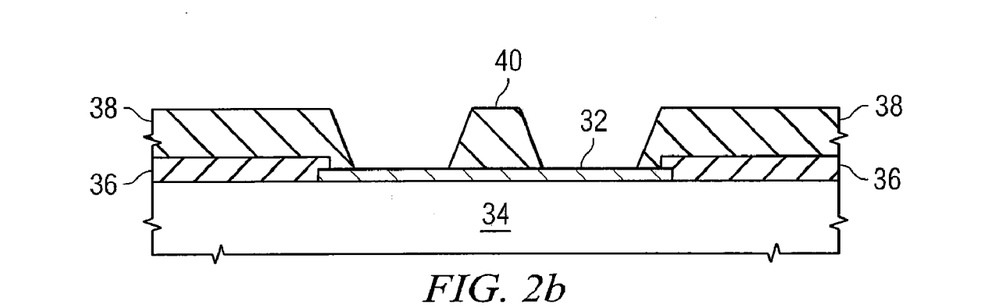
Figure 2C:
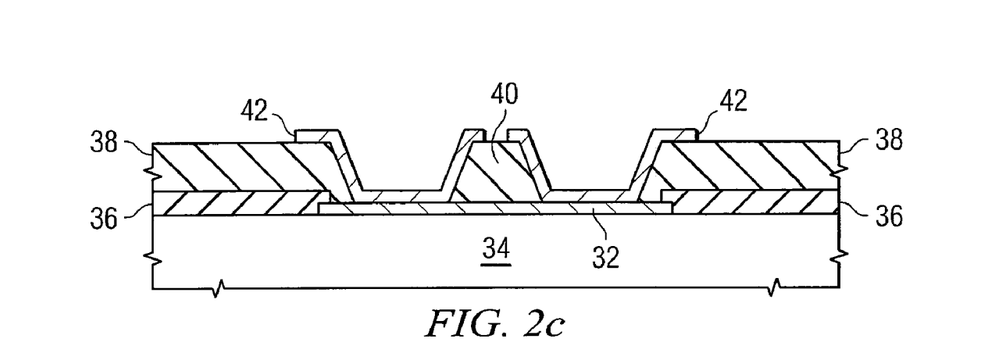

FIGS. 2a-2c illustrate cross-sectional views of the formation of a support structure for a solder bump. Note that for FIGS. 2-6 the wafer is oriented with its active surface facing up. In FIG. 2a, metal contact pad 32 is formed on silicon substrate 34. Contact pad 32 is made of aluminum (Al), copper (Cu), or aluminum/copper alloys. Contact pad 32 electrically connected to active and passive devices through conduction layers formed on substrate 34. A solder bump will later be formed to connect to the metal contact pad. A first passivation layer 36 is formed over substrate 34 with an opening to expose metal contact pad 32. The opening is realized by removing a portion of passivation layer 36 through a photoresist mask defined etching process. The first passivation layer 36 can be made with silicon nitride (SiN), silicon dioxide (SiO2), silicon oxynitride (SiON), polyimide, benzocyclobutene (BCB), lead oxide (PBO), or other insulating material.

In FIG. 2b, a second passivation layer or repassivation layer 38 is formed over the first passivation layer 36. The second passivation layer can be made with SiN, SiO2, SiON, polyimide, BCB, PBO, or other insulating material. A first and second portion of the second passivation layer 38 is removed by a photoresist mask defined etching process to expose metal contact pad 32 and form passivation island 40. Passivation island 40 is that portion of passivation layer 38 remaining after removing the first and second portions of passivation layer 38 to expose contact pad 32. The passivation island 40 is disposed approximately central to metal contact pad 32.

In FIG. 2c, UBM layer 42 is formed over passivation layer 38, metal contact pad 32, and passivation island 40. UBM layer 42 is an intermediate conductive layer formed between metal contact pad 32 and the solder bump. UBM layer 42 is deposited by electroless plating, sputtering, or electroplating. UBM layer 42 can be an electrically conductive multiple layer with adhesion, barrier, and wetting layers. The adhesion layer can be made of chromium (Cr), titanium tungsten (TiW), titanium (Ti), and Al. The barrier layer is optional, and can be nickel (Ni), NiV, CrCu, TiN, and TiW. The wetting layer can be made of Cu, Au, and Ag. UBM layer 42 follows the contour of passivation layer 38 and contact pad 32, including passivation island 40 which extends above the surface of contact pad 32. A portion of UBM layer 42 is removed by a photoresist mask defined etching process to expose a top surface of passivation island 40. Thus, UBM layer 42 does not completely cover passivation island 40, but rather leaves a top center portion of the passivation island exposed.

Figure 3A:
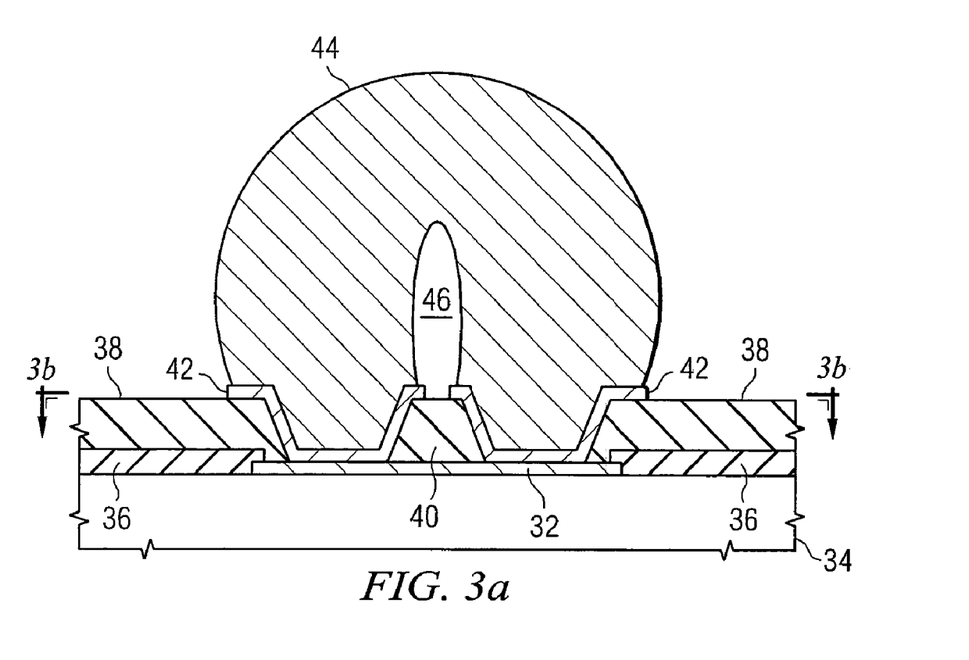
FIGS. 3a-3b illustrate formation of the solder bump having a controlled void over a UBM structure and passivation island.

In FIG. 3a, solder bump or ball 44 is formed over the UBM layer 42 and supporting structure. After deposition of UBM layer 42, the solder bump is formed by depositing electrically conductive material by evaporation, electrolytic plating, electroless plating, or screen printing. The electrically conductive material is any metal, e.g., tin (Sn), lead (Pb), Ni, gold (Au), silver (Ag), Cu, bismuthinite (Bi), and alloys thereof, or mixtures of other conductive materials. In one embodiment, the solder bump is 63 percent weight of Sn and 37 percent weight of Pb. The solder material reflows by heating the conductive material above its melting point to form a spherical ball or bump 44 disposed over semiconductor substrate 34. Solder bump 44 is disposed over and electrically contacts UBM layer 42 and metal contact pad 32. An etching process removes any portion of the UBM material outside a region of the solder bump structure, for example in applications where the UBM layers extend continuously between adjacent solder bumps.

During the solder reflow process, a controlled void 46 is formed in an interior portion of solder bump 44 above the exposed portion of passivation island 40. The void is controlled in terms of its formation, i.e., width, height, depth, and volume. As the reflow solder fills the recessed areas between passivation layer 38 and passivation island 40, void 46 is formed by nature of passivation island 40 extending above contact pad 32. The passivation island constitutes a bump in the otherwise flat surface of UBM layer 42 that inhibits the complete reflow of solder around its structure. Thus, the passivation island, with the absence of UBM material over its top portion, creates the controlled void in the solder bump. The depth and volume of void 46 is controlled by the width and height of passivation island 40 and reflow profile.

As a feature of the present invention, passivation island 40 and controlled void 46 relieves stress on the solder bump and its electrical connection to UBM layer 42. The controlled void acts as a buffer zone in the presence of external stress to the solder bump. As discussed in the background, the flip chip packages often undergo a drop test to confirm the integrity and reliability of the solder bump interconnection between the die and carrier substrate. The drop test induces stress on the flip chip package by the impact of the package against the test surface. If the solder bump connections are weak or defective, the drop test will crack or break one or more connections and cause the package to fail subsequent inspection or electrical test. Solder bump 44 with controlled void 46, resulting from passivation island 40 inhibiting the solder reflow process around the island, relieves stress on the solder bump and strengthens the flip chip interconnect integrity to survive the drop test. The solder bump with controlled void improves the flip chip reliability and manufacturing yield during testing.

Figure 3B:
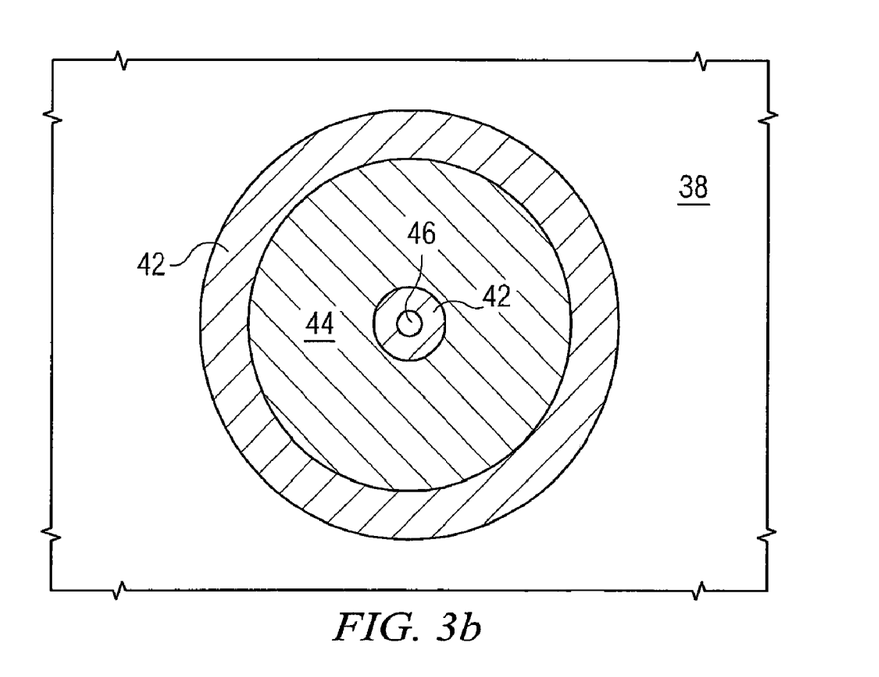

FIG. 3b is a top view of solder ball 44 surrounding metal controlled void 46. UBM layer 42 resides between solder ball 44 and contact pad 32.

Figure 4A:
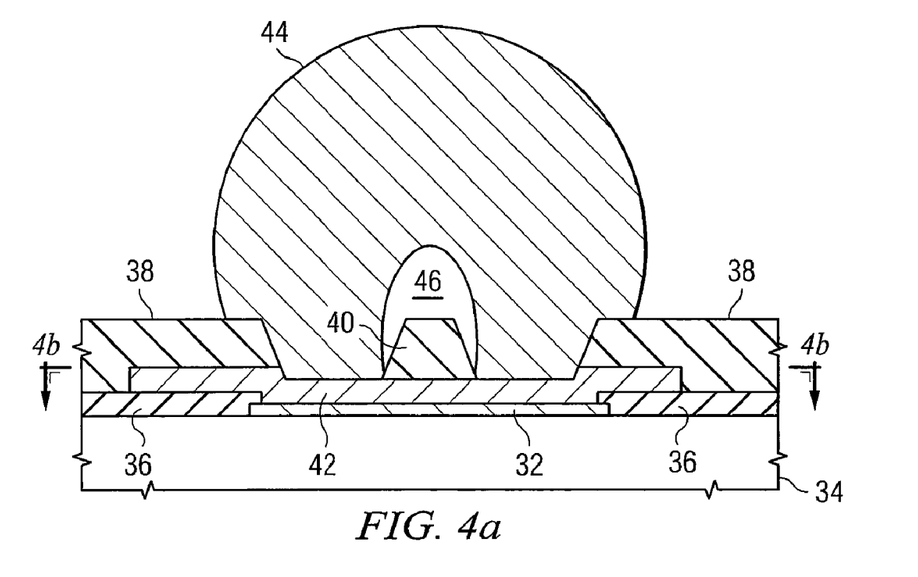
FIGS. 4a-4b illustrate an alternate embodiment of forming the solder bump with controlled void over a UBM structure and passivation island.

An alternate embodiment of the flip chip package is shown in FIG. 4a. In this embodiment UBM layer 42 is formed over passivation layer 36 and metal contact pad 32. UBM layer 42 is an intermediate conductive layer formed between metal contact pad 32 and the solder bump. UBM layer 42 is deposited by electroless plating, sputtering, or electroplating. UBM layer 42 can be an electrically conductive multiple layer with adhesion, barrier, and wetting layers. The adhesion layer can be made of Cr, TiW, Ti, and Al. The barrier layer is optional, and can be Ni, NiV, CrCu, TiN, and TiW. The wetting layer can be made of Cu, Au, and Ag. UBM layer 42 follows the contour of passivation layer 36 and contact pad 32. A second passivation layer 38 is formed over the first passivation layer 36 and UBM layer 42. The second passivation layer can be made with SiN, SiO2, SiON, polyimide, BCB, PBO, or other insulating material. A first and second portion of the second passivation layer 38 is removed by a photoresist mask defined etching process to expose UBM layer 42 and form passivation island 40. Passivation island 40 is that portion of passivation layer 38 remaining after removing the first and second portions of passivation layer 38 to expose UBM layer 42. The passivation island 40 is disposed approximately central to metal contact pad 32.

A solder bump or ball 44 is formed over UBM layer 42 and passivation island 40. The solder bump is formed by depositing electrically conductive material by evaporation, electrolytic plating, electroless plating, or screen printing. The electrically conductive material can be any metal, e.g., Sn, Pb, Ni, Au, Ag, Cu, Bi, and alloys thereof, or mixtures of other conductive materials. In one embodiment, the solder bump is 63 percent weight of Sn and 37 percent weight of Pb. The solder material reflows by heating the conductive material above its melting point to form a spherical ball or bump 44 disposed over semiconductor substrate 34. Solder bump 44 is disposed over and electrically contacts UBM layer 42 and metal contact pad 32. An etching process removes any portion of the UBM layer outside a region of the solder bump structure.

During the solder reflow process, a controlled void 46 is formed in an interior portion of solder bump 44 above passivation island 40. As the reflow solder fills the recessed areas between passivation layer 38 and passivation island 40, void 46 is formed by nature of passivation island 40 extending above UBM layer 42. The passivation island constitutes a bump in the otherwise flat surface of UBM layer 42 that inhibits the complete reflow of solder around its structure. Thus, the passivation island creates the controlled void in the solder bump. The depth and volume of void 46 is controlled by the width and height of passivation island 40 and reflow profile.

The passivation island and controlled void 46 relieves stress on the solder bump and its electrical connection to UBM layer 42 and contact pad 32. The controlled void acts as a buffer zone in the presence of external stress to the solder bump. Solder bump 44 with controlled void 46, resulting from passivation island 40 inhibiting the solder reflow process around the island, relieves stress on the solder bump and strengthens the flip chip interconnect integrity to survive the drop test. The solder bump with controlled void improves the flip chip reliability and manufacturing yield during testing.

Figure 4B:
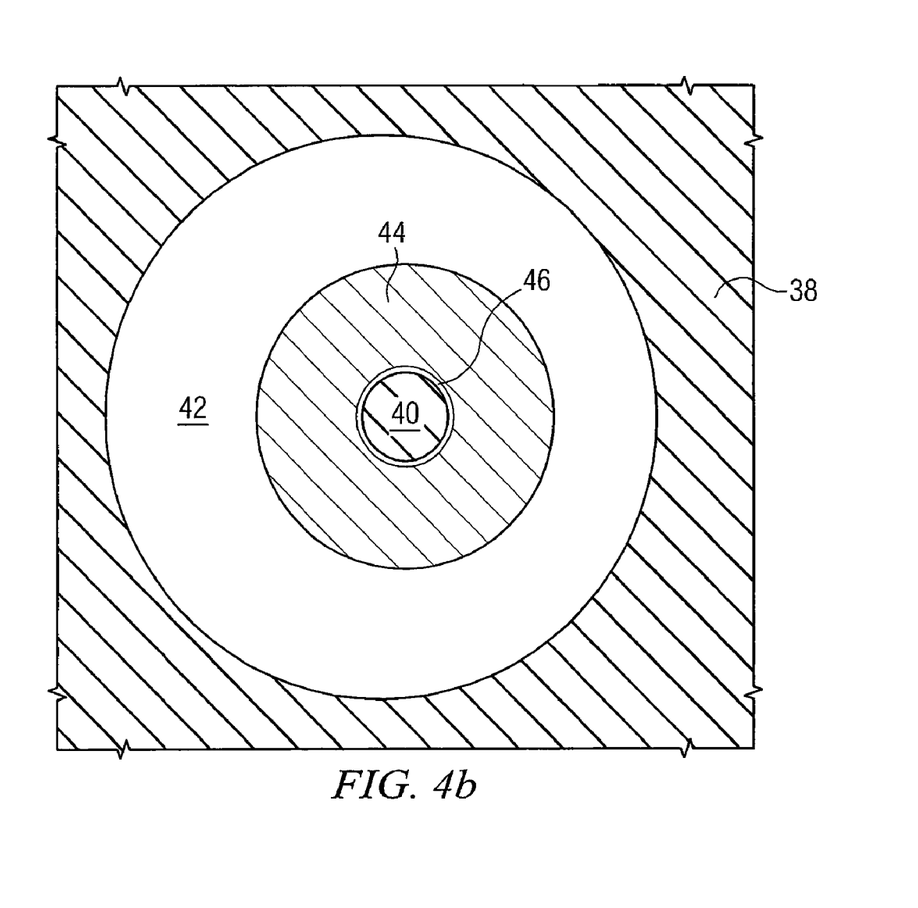

FIG. 4b is a top view of the UBM layer 42 residing between solder bump 44 and contact pad 32. Passivation island 40 resides in the center of the solder bump. Controlled void 46 is formed over the passivation island.

Figure 5A:
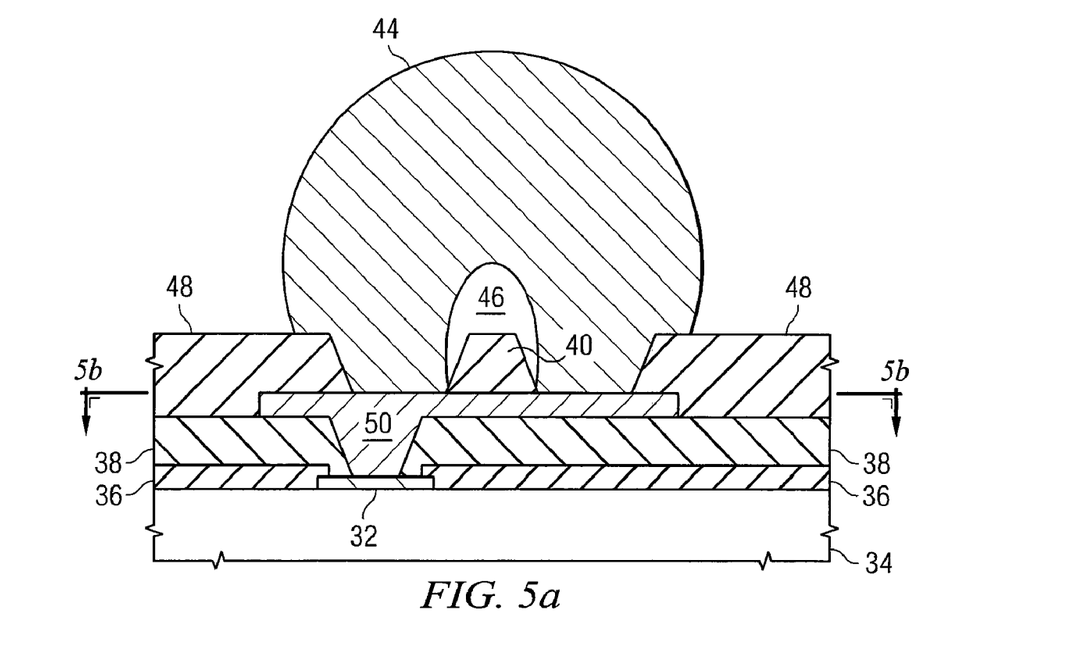
FIGS. 5a-5b illustrate an alternate embodiment of forming the solder bump with controlled void over an RDL structure with and passivation island.

Another embodiment of the flip chip package is shown in FIG. 5a. A second passivation layer or repassivation layer 38 is formed over the first passivation layer 36. The second passivation layer can be made with SiN, SiO2, SiON, polyimide, BCB, PBO, or other insulating material. A portion of the second passivation layer 38 is removed by a photoresist mask defined etching process to expose metal contact pad 32. Redistribution layer (RDL) 50 is formed over passivation layer 38, filling the void created by etching the passivation down to contact pad 32. RDL 50 is deposited by electroless plating, sputtering, or electroplating. RDL 50 is an intermediate conductive layer formed to create an offset between metal contact pad 32 and the solder bump. RDL 50 is deposited by electroless plating, sputtering, or electroplating. RDL 50 can be an electrically conductive multiple layer with adhesion, barrier, and wetting layers. The adhesion layer can be made of Cr, TiW, Ti, and Al. The barrier layer is optional, and can be Ni, NiV, CrCu, TiN, and TiW. The wetting layer can be made of Cu, Au, and Ag. RDL 50 follows the contour of passivation layer 38 and contact pad 32. A third passivation layer 48 is formed over passivation layer 38 and RDL 50. A first and second portion of the third passivation layer 48 is removed by a photoresist mask defined etching process to create passivation island 40. Passivation island 40 is that portion of passivation layer 48 remaining after removing the first and second portions of passivation layer 48 to expose RDL 50. The passivation island 40 is offset from metal contact pad 32 by nature of RDL 50.

In the embodiment of FIG. 5a, solder bump or ball 44 is formed over RDL 50 and supporting structure. After deposition of RDL 50, the solder bump is formed by depositing electrically conductive material by evaporation, electrolytic plating, electroless plating, or screen printing. The electrically conductive material is any metal, e.g., Sn, Pb, Ni, Au, Ag, Cu, Bi, and alloys thereof, or mixtures of other conductive materials. In one embodiment, the solder bump is 63 percent weight of Sn and 37 percent weight of Pb. The solder material reflows by heating the conductive material above its melting point to form a spherical ball or bump 44 disposed over semiconductor substrate 34. Solder bump 44 is disposed over and electrically contacts RDL 50 and metal contact pad 32.

During the solder reflow process, a controlled void 46 is formed in an interior portion of solder bump 44 above the exposed portion of passivation island 40. As the reflow solder fills the recessed areas between passivation layer 48 and passivation island 40, void 46 is formed by nature of passivation island 40 extending above RDL 50. The passivation island constitutes a bump in the otherwise flat surface of RDL 50 that inhibits the complete reflow of solder around its structure. Thus, the passivation island creates the controlled void in the solder bump. The depth and volume of void 46 is controlled by the width and height of passivation island 40 and reflow profile.

Figure 5B:
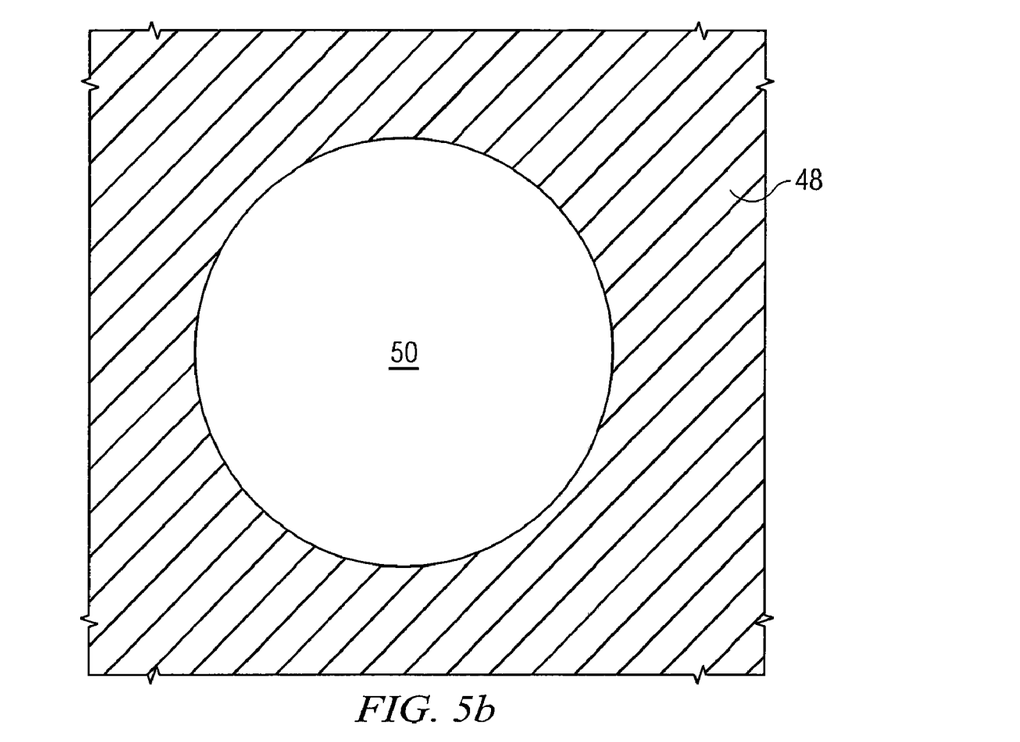

The controlled void 46 relieves stress on the solder bump and its electrical connection to RDL 50. The controlled void acts as a buffer zone in the presence of external stress to the solder bump. Solder bump 44 with controlled void 46, resulting from passivation island 40 inhibiting the solder reflow process around the island, relieves stress on the solder bump and strengthens the flip chip interconnect integrity to survive the drop test. The solder bump with controlled void improves the flip chip reliability and manufacturing yield during testing. FIG. 5b is a top view of RDL 50 surrounded by passivation layer 48.

Figure 6A:
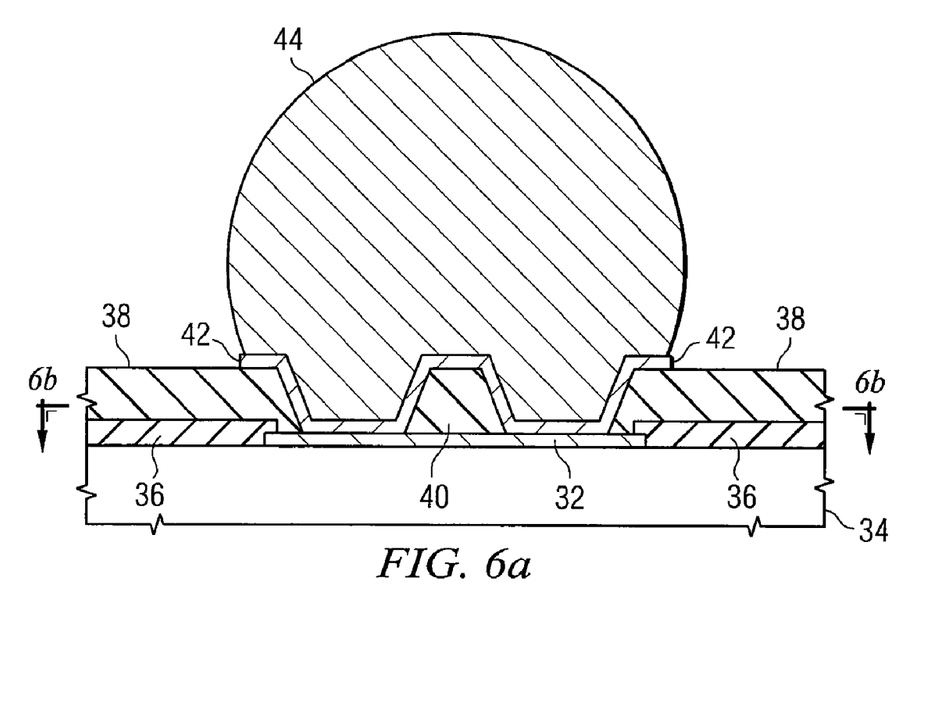
FIGS. 6a-6b illustrate an alternate embodiment of forming the solder bump over a UBM structure and passivation island.

Another embodiment of the flip chip package is shown in FIG. 6a. A second passivation layer or repassivation layer 38 is formed over the first passivation layer 36. The second passivation layer can be made with SiN, SiO2, SiON, polyimide, BCB, PBO, or other insulating material. A portion of the second passivation layer 38 is removed by a photoresist mask defined etching process to expose metal contact pad 32 and form passivation island 40. The passivation island 40 is disposed approximately in the center of metal contact pad 32. UBM layer 42 is formed over passivation layer 38, metal contact pad 32, and passivation island 40. UBM layer 42 is deposited by electroless plating, sputtering, or electroplating. UBM layer 42 is an intermediate conductive layer formed between metal contact pad 32 and the solder bump. UBM layer 42 is deposited by electroless plating, sputtering, or electroplating. UBM layer 42 can be an electrically conductive multiple layer with adhesion, barrier, and wetting layers. The adhesion layer can be made of Cr, TiW, Ti, and Al. The barrier layer is optional, and can be Ni, NiV, CrCu, TiN, and TiW. The wetting layer can be made of Cu, Au, and Ag. UBM layer 42 follows the contour of passivation layer 38 and contact pad 32, including passivation island 40 which extends above the surface of contact pad 32. In this case, UBM layer 42 completely covers passivation island 40.

Figure 6B:
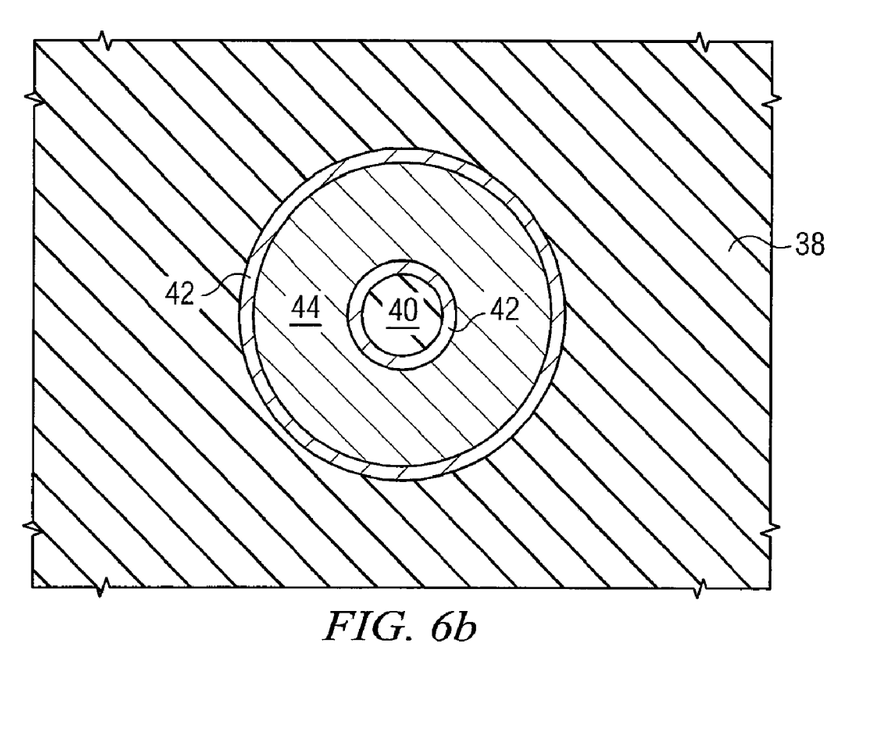

In the embodiment of FIG. 6a, solder bump or ball 44 is formed over the UBM layer 42 and supporting structure. After deposition of UBM layer 42, the solder bump is formed by depositing electrically conductive material by evaporation, electrolytic plating, electroless plating, or screen printing. The electrically conductive material is any metal, e.g., Sn, Pb, Ni, Au, Ag, Cu, Bi, and alloys thereof, or mixtures of other conductive materials. In one embodiment, the solder bump is 63 percent weight of Sn and 37 percent weight of Pb. The solder material reflows by heating the conductive material above its melting point to form a spherical ball or bump 44 disposed over semiconductor substrate 34. Solder bump 44 is disposed over and electrically contacts UBM layer 42 and metal contact pad 32. An etching process removes any portion of the UBM layer outside a region of the solder bump structure. FIG. 6b is a top view of UBM layer 42 surrounding solder bump 44 and passivation island 40.

In summary, the formation of the passivation island relieves stress on the solder bump and its electrical connection to RLD/UBM layer and the metal contact pad. The passivation island strengthens the flip chip interconnect integrity to help survive the drop test. The solder bump formed over the passivation island improves the flip chip reliability and manufacturing yield during test.

While one or more embodiments of the present invention have been illustrated in detail, the skilled artisan will appreciate that modifications and adaptations to those embodiments may be made without departing from the scope of the present invention as set forth in the following claims.

What is claimed is:

1. A semiconductor package, comprising:
   a substrate having a plurality of active devices formed thereon;
   a contact pad formed on the substrate in electrical contact with the plurality of active devices;
   a passivation layer disposed above the substrate, wherein a portion of the passivation layer is removed to create a passivation island isolated from the passivation layer by the removed portion;
   an under bump metallization (UBM) layer disposed over the contact pad and around the passivation island, wherein a center portion of the passivation island is devoid of the UBM layer; and
   a bump formed directly on the passivation island and in contact with the UBM layer, wherein the center portion of the passivation island being devoid of the UBM layer forms a controlled void in the bump for stress relief.

2. The semiconductor package of claim 1, wherein the passivation island is centered with respect to the contact pad.

3. The semiconductor package of claim 1, wherein the passivation island is offset from the contact pad.

4. The semiconductor package of claim 1, wherein the UBM layer is disposed above the passivation layer.

5. The semiconductor package of claim 1, wherein the passivation layer is disposed above the UBM layer.

6. A semiconductor package, comprising:
   a substrate having a plurality of active devices formed thereon;
   a contact pad formed on the substrate in electrical contact with the plurality of active devices;
   an intermediate conductive layer disposed above the substrate in electrical contact with the contact pad;
   a passivation layer formed over the substrate, wherein a portion of the passivation layer is removed to create a passivation island having a top portion which is devoid of the intermediate conductive layer; and
   a bump formed directly on the passivation island and in contact with the intermediate conductive layer, wherein the top portion of the passivation island being devoid of the intermediate conductive layer forms a void in the bump which provides stress relief for the bump.

7. The semiconductor package of claim 6, wherein the passivation island is centered with respect to the contact pad.

8. The semiconductor package of claim 6, wherein the passivation island is offset from the contact pad.

9. The semiconductor package of claim 6, wherein the intermediate conduction layer is disposed above the passivation layer.

10. The semiconductor package of claim 6, wherein the passivation layer is disposed above the intermediate conduction layer.

11. A semiconductor package, comprising:
    a substrate having a plurality of active devices formed thereon;
    a contact pad formed on the substrate in electrical contact with the plurality of active devices;

a passivation layer formed over the substrate, wherein a portion of the passivation layer is removed to create a passivation island isolated from the passivation layer by the removed portion;

an under bump metallization (UBM) layer disposed over the contact pad and around the passivation island, wherein a top portion of the passivation island is devoid of the UBM layer; and a bump formed over the passivation island in electrical contact with the contact pad, wherein the top portion of the passivation island being devoid of the UBM layer forms a void in the bump for stress relief.

12. The semiconductor package of claim 11, further including a conductive layer disposed between the bump and the contact pad.

13. The semiconductor package of claim 11, wherein the passivation island is centered with respect to the contact pad.

14. The semiconductor package of claim 11, wherein the passivation island is offset from the contact pad.

* * * * *